United States Patent [19]

Yoshimoto

[11] Patent Number: 4,849,937

[45] Date of Patent: Jul. 18, 1989

[54] DIGITAL DELAY UNIT WITH INTERLEAVED MEMORY

[75] Inventor: Masahiko Yoshimoto, Itami, Japan

[73] Assignee: Mitsubishi Denki Kabushiki Kaisha, Tokyo, Japan

[21] Appl. No.: 169,066

[22] Filed: Mar. 17, 1988

Related U.S. Application Data

[63] Continuation of Ser. No. 804,073, Dec. 3, 1985, abandoned.

[30] Foreign Application Priority Data

Dec. 14, 1984 [JP] Japan .................. 59-264738
Dec. 17, 1984 [JP] Japan .................. 59-267954

[51] Int. Cl.$^4$ .......................... G11C 7/00; G11C 8/00
[52] U.S. Cl. .................... 365/189.05; 365/194; 365/230.04; 365/233; 365/236; 340/799
[58] Field of Search ............. 365/189, 194, 230, 233; 340/799, 802, 750; 364/200 MS File, 900 MS File

[56] References Cited

U.S. PATENT DOCUMENTS

| | | | |
|---|---|---|---|
| 3,866,180 | 2/1975 | Willette .................. | 364/200 |
| 4,122,489 | 10/1978 | Bolger et al. ............. | 358/21 R |
| 4,171,538 | 10/1979 | Sheller ................... | 364/900 |
| 4,361,869 | 11/1982 | Johnson et al. ............ | 364/200 |
| 4,513,372 | 4/1985 | Ziegler et al. ............ | 365/230 |
| 4,740,923 | 4/1988 | Kaneko et al. ............. | 365/230 |

FOREIGN PATENT DOCUMENTS 2415600 10/1974 Fed. Rep. of Germany.
2364254 3/1976 Fed. Rep. of Germany.
2751022 5/1978 Fed. Rep. of Germany.

OTHER PUBLICATIONS

"Television Gakkaishi (The Journal of the Institute of Television Engineers of Japan)", vol. 39, No. 3 (1985), pp. 250 to 252.

Primary Examiner—Stuart N. Hecker
Assistant Examiner—Glenn A. Gossage
Attorney, Agent, or Firm—Lowe, Price, LeBlanc, Becker & Shur

[57] ABSTRACT

A first memory cell array (84) has an even address space and a second memory cell array 94 has an odd address space. The memory cell arrays (84, 94) are alternately accessed by even address signals generated from an address counter (81) and odd address signals generated from an address counter (91) so that the data stored in the memory cell arrays are alternately read while new input data are written in the accessed memory cells.

4 Claims, 7 Drawing Sheets

DIGITAL DELAY UNIT WITH INTERLEAVED MEMORY

This application is a continuation of application Ser. No. 804,073, filed Dec. 3, 1985 now abandoned.

BACKGROUND OF THE INVENTION

1. Field of the Invention

The present invention relates to a digital delay unit, and more particularly, it relates to a digital delay unit for processing, e.g., video signals in a digital television receiver.

2. Description of the Prior Art

Generally employed as a mass storage digital delay means is the so-called digital delay unit for sequentially writing/reading signals in/from memory cells arrayed in the form of a matrix to arbitrarily delay the signals. FIG. 1 is a block diagram showing an example of a conventional digital delay unit. In FIG. 1, an input terminal 1 receives basic clock pulses $\phi_S$. The unit delay (minimum delay width) in the digital delay unit is equal to one cycle of the basic clock pulses $\phi_S$. The basic clock pulses $\phi_S$ inputted from the input terminal 1 are supplied to an address counter 2. The address counter 2 is incremented on the leading edges of the basic clock pulses $\phi_S$, to output X addresses to an X decoder 3 and Y addresses to a Y decoder 4. Outputs from the X decoder 3 are supplied to a memory cell array 5 while those from the Y decoder 4 are supplied to a transfer gate 6.

On the other hand, input terminals $13_1$ to $13_n$ are adapted to receive input data synchronously inputted with the basic clock pulses $\phi_S$, and are described herein in structure for receiving n-bit input data. The most significant bit (MSB) of the input data is supplied to the terminal $13_1$ while the least significant bit (LSB) is supplied to the terminal $13_n$. The inupt data are supplied to a write circuit 10 which is controlled by signals WE through an input latch 11. The memory cell array 5 is formed by a group of memory cells arrayed in the form of a matrix, and the storage capacity thereof is M×n bits. The transfer gate 6 transfers data read from the memory cell array 5 to a sense amplifier 7 while transferring data from the write circuit 10 to the memory cell array 5. The sense amplifier 7 is controlled by signals SE to amplify the read data. A data latch 8 temporarily stores outputs from the sense amplifier 7. During a period of time when the signals SE are at low levels, the data latch 8 is electrically cut off from the sense amplifier 7. An output latch 9 generates delayed outputs from the data latch 8 in the cycle of the basic clock pulses $\phi_S$, to supply the same to output terminals $12_1$ to $12_n$. The MSB of the output data is outputted from the terminal $12_1$ while the LSB is outputted from the terminal $12_n$.

The basic clock pulses $\phi_S$ received through the input terminal 1 are further supplied to a timing generator 14, which in turn generates the aforementioned signals SE and WE in such timing sequence as shown in FIG. 2. The signals SE are adapted to drive the sense amplifier 7 in high-level periods thereof while the signals WE are adapted to drive the write circuit 10 in high-level periods thereof. The address counter 2 is reset per M cycles by a reset circuit (not shown). The conventional digital delay unit is in the aforementioned structure.

The PAL system television receiver, implemented by the structure as shown in FIG. 1 is a one-line memory for sampling analog video signals at the frequency of 4 $f_{sc}$($f_{sc}$: chrominance subcarrier frequency) to generate digital video signals and delay the same by one scanning line (1H) on the following conditions: M=1135, n=8, X addresses=$X_0$ to $X_7$, Y addresses=$Y_0$ to $Y_2$, and one cycle of the basic clock pulses $\phi_S$ is equal to 56 ns.

Operation of the conventional digital delay unit as shown in FIG. 1 is now described with reference to a timing chart as shown in FIG. 2. In this case, delay of M cycles is obtained by an M×n-bit memory having an address space for addresses $A_1$ to $A_M$ for processing n-bit data in a parallel manner. The memory cell array 5 employed in this digital delay unit is formed by n memory cell groups having M-bit address capacity, and one memory cell in each group corresponds to one address. Therefore, when an address is designated, n memory cells in total are accessed from the n memory cell groups in a parallel manner. In a memory of the so-called byte structure, the number n is equal to 8. In the following description, symbols $D_1$ to $D_M$ indicate input data newly stored in the addresses $A_1$ to $A_M$ respectively and symbols $PD_1$ to $PD_M$ indicate output data read from the addresses $A_1$ to $A_M$ respectively.

First, the address counter 2 is driven by the basic clock pulses $\phi_S$ to supply X addresses to the X decoder 3 and Y addresses to the Y decoder 4. Then outputted to an I/O line 17 are data of n-bit memory cells in total belonging to columns coupled to the transfer gate 6 selected by the Y decoder 4 within the memory cells belonging to rows selected by the X decoder 3 in the memory cell array 5. For example, when the address $A_1$ is designated by the output from the address counter 2, data $PD_1$ on n memory cells in total positioned in respective addresses $A_1$ of the n memory cell groups are read in parallel through the transfer gate 6. The n-bit data $PD_1$ thus read are amplified by the sense amplifier 7 in a high-level period of the signal SE, to be fetched in the data latch 8. The data latch 8 is electrically cut off from the sense amplifier 7 on the trailing edge of the signal SE, thereby to hold the read data $PD_1$ for the low-level period of the signal SE. The read data $PD_1$ are transferred to the output latch 9, to be outputted from the n output terminals $12_1$ to $12_n$ in a parallel manner. Thus, the data are sequentially read in correspondence to change of the address signals per one cycle of the basic clock pulses $\phi_S$ as shown in FIG. 2.

In the same address designating period after the fall of the signal SE, the write circuit 10 is driven in a high-level period of the signal WE to transfer n-bit input data received from an input latch 11 to the I/O line 17 to reload the data on the currently selected memory cells. For example, immediately after the preceding data $PD_1$ are read from the address $A_1$ to be stored in the data latch 8, new data $D_1$ are written in the memory cells of the address $A_1$. The data $D_I$ are read when the address $A_1$ is again designated after M cycles. Thus, read-modified-write operation is performed every M cycles for the memory cells of the respective addresses so that newly written data are outputted after M cycles, thereby to obtain delay of M cycles.

In the conventional digital delay unit, read/write operation must be performed within one cycle of the basic clock pulses $\phi_S$ as hereinabove described. Therefore, the cycle of the basic clock pulses $\phi_S$ must be determined in consideration of read access time to data latch, writing completion time (pulse width of the signals WE), pulse width of the signals SE, timing margins between the address signals and the like, and it has been difficult to attain high-speed operation. For example, a cycle time of 56 ns is required for a digital delay unit applied to a PAL system television receiver, and if the aforementioned structure is employed in conventional process technique, the read-modified-write operation must be performed within the period of 56 ns. Thus, it has been difficult to drive the digital delay unit with sufficient timing margins.

An example of the aforementioned type prior art is disclosed in, e.g., "Television Gakkaishi (The journal of the institute of television engineers of Japan)" Vol. 39, No. 3 (1985) pp. 250 to 252. In this prior art literature, examples as shown in FIGS. 6 and 7 are at low speeds while an example as shown in FIG. 8 is at a high speed whereas the memory capacity is doubled, leading to increase in cost.

SUMMARY OF THE INVENTION

An object of the present invention is to provide a digital delay unit which can operate at a higher speed than the conventional digital delay unit through use of conventional process technique, without increasing the cost.

Briefly stated, the present invention provides a digital delay unit comprising a memory cell group arrayed in the form of a matrix divided into two address spaces which are alternately accessed so that data read from the two address spaces are alternately outputted at the clock rate of basic clock pulses and input data received synchronously with the basic clock pulses are alternately written in the two address spaces.

According to the present invention, the respective address spaces are driven substantially at the clock rate for two cycles of the basic clock pulses while data input/output operation is completed virtually in the same cycle as that of the basic clock pulses, whereby the digital delay unit can be driven at a high speed at the clock rate half the minimum operational cycle of each address space while maintaining sufficient timing margins. Thus, there is no need to increase the memory capacity, to effectively prevent increase in cost.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
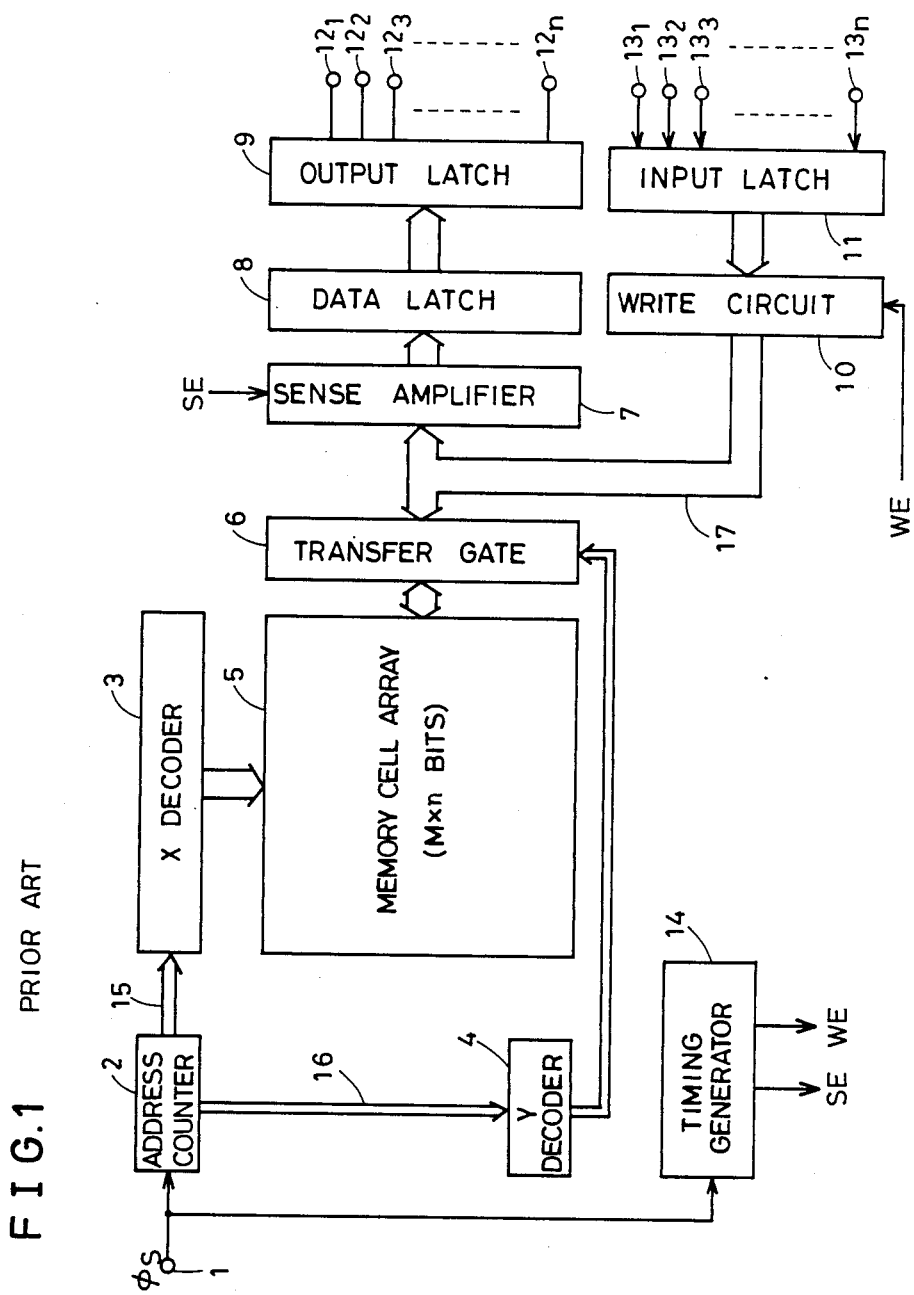
FIG. 1 is a block diagram showing an example of a conventional digtal delay unit.
Figure 2:
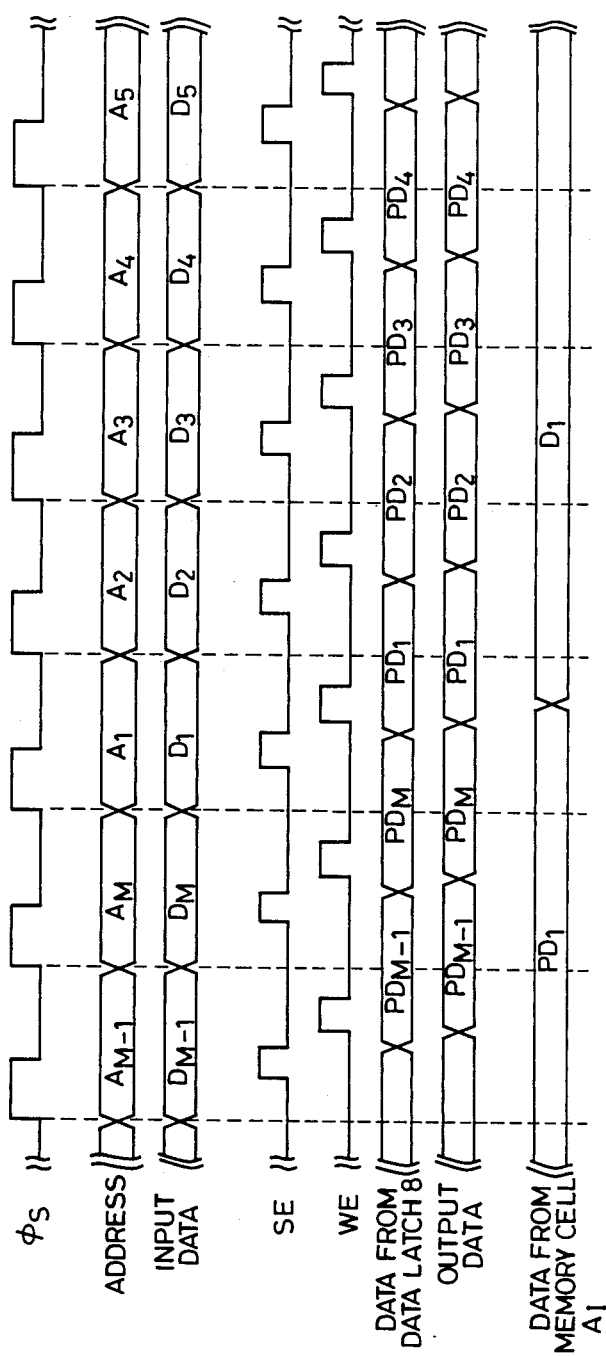
FIG. 2 is a timing chart for illustrating operation of the conventional digital delay unit as shown in FIG. 1.
Figure 3:
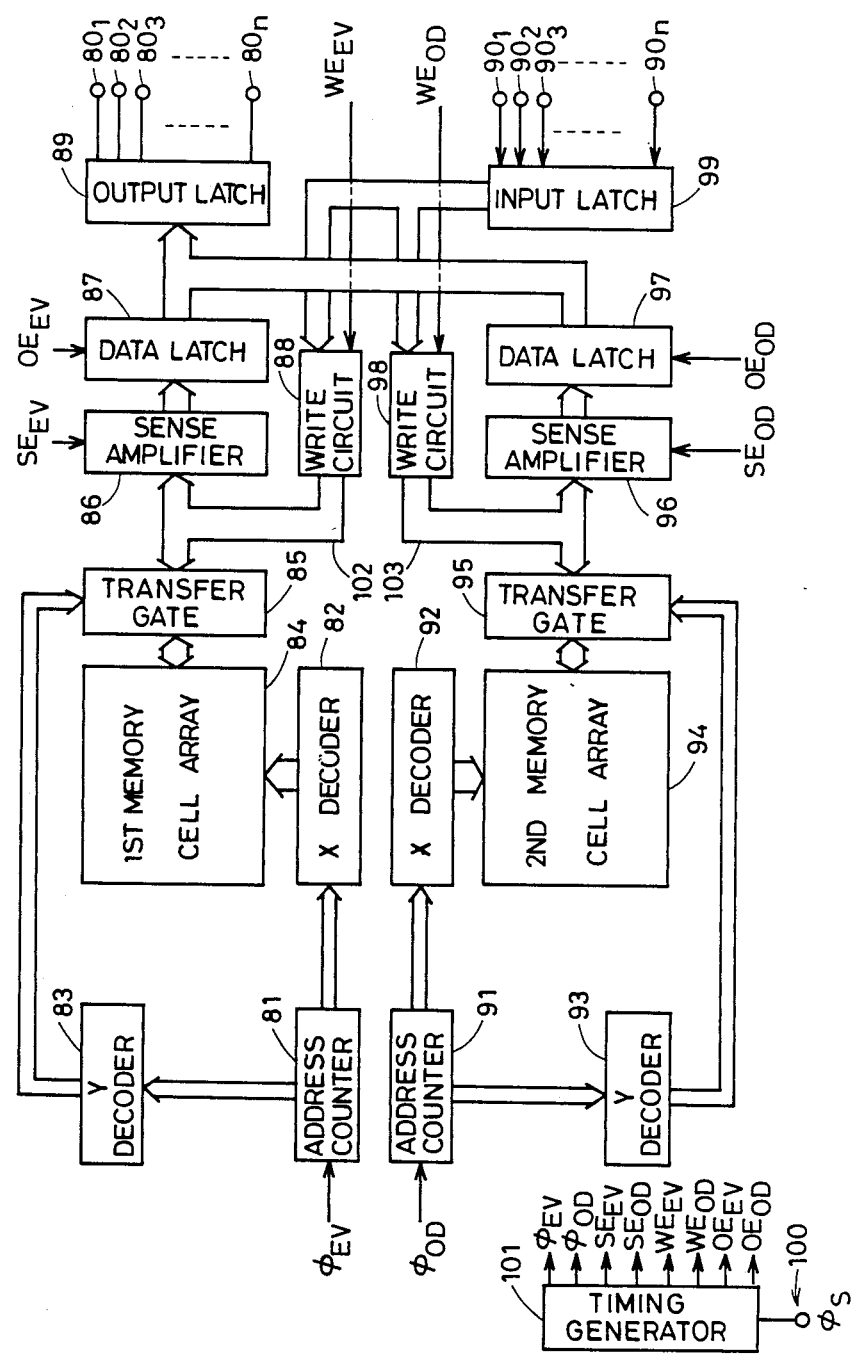
FIG. 3 is a block diagram showing an embodiment of the present invention.

FIG. 3 is a block diagram showing an embodiment of the present invention. In FIG. 3, a digital delay unit according to the present invention is adapted to delay n-bit input data by M cycles to output the same, and its address space corresponding to the delay amount is divided into two memory cell arrays. A first memory cell array 84 forms an even address plane and a second memory cell array 94 forms an odd address plane, and the memory capacity of each memory cell array is $(M/2) \times n$ bits. Input terminals $90_1$ to $90_n$ are adapted to receive n-bit input data at the clock rate of basic clock pulses $\phi_S$. The input data are supplied through an input latch 99 to write circuits 88 and 98.

Figure 4:
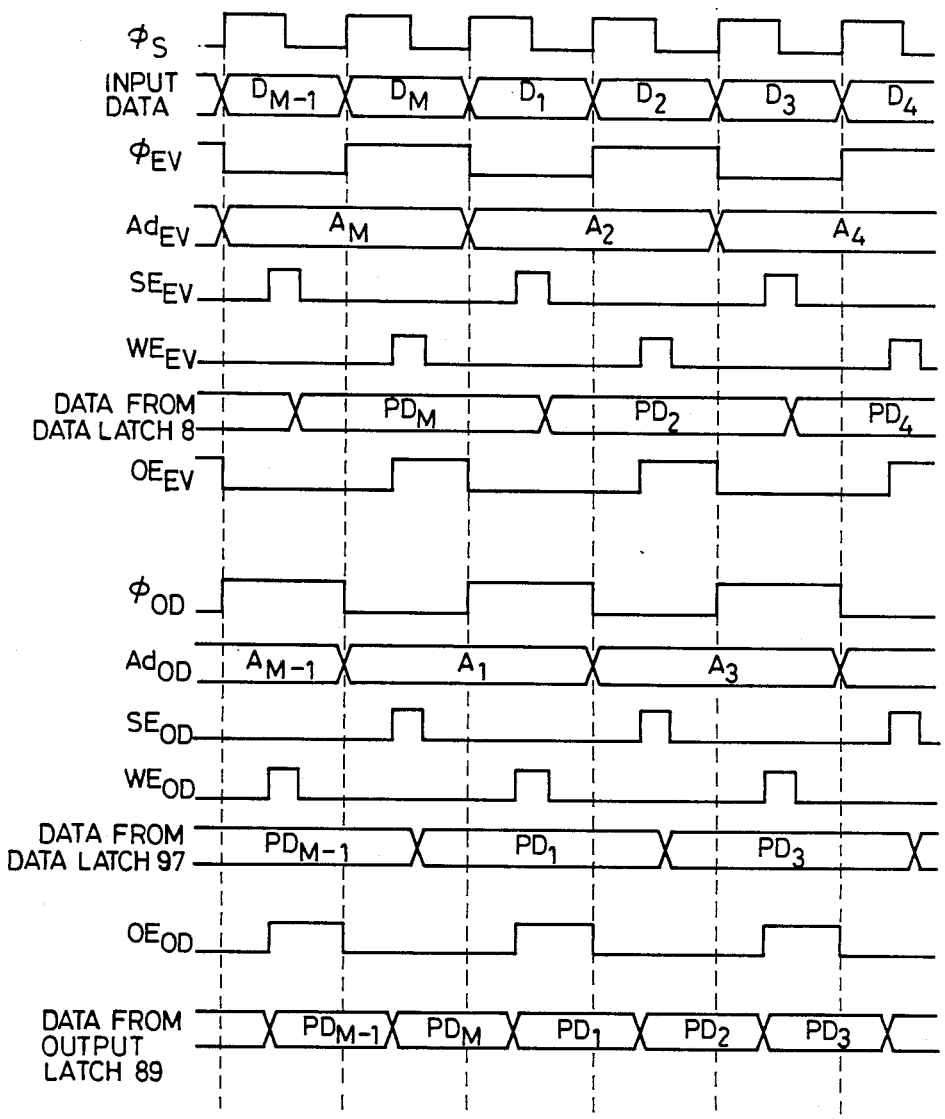
FIG. 4 is a timing chart for illustrating operation of the embodiment as shown in FIG. 3.

A timing generator 101 receives the basic clock pulses $\phi_S$ from an input terminal 100 to generate various timing signals $\phi_{EV}$, $\phi_{OD}$, $SE_{EV}$, $SE_{OD}$, $WE_{EV}$, $WE_{OD}$, $OE_{EV}$ and $OE_{OD}$ on the basis of the basic clock pulses $\phi_S$, in timing sequence as shown in FIG. 4. One cycle of the basic clock pulses $\phi_S$ is equivalent to the unit delay. The signals $\phi_{EV}$ are obtained by frequency division of the basic clock pulses $\phi_S$ to be doubled in cycle, and adapted to increment an address counter 81 on the trailing edges thereof. The signals $\phi_{OD}$ are formed by clocks antiphase to the signals $\phi_{EV}$, and increment an address counter 91 on the trailing edges thereof. The signals $SE_{EV}$ and $SE_{OD}$ respectively control sense amplifiers 86 and 96 to drive the same in high-level periods thereof. The signals $WE_{EV}$ and $WE_{OD}$ respectively control the write circuits 88 and 98 to drive the same in high-level periods thereof. The signals $OE_{EV}$ control outputs of a data latch 87 while the signals $OE_{OD}$ control outputs of a data latch 97.

The address counter 81 receives the signals $\phi_{EV}$ to supply even X address signals to an X decoder 82 and even Y address signals to a Y decoder 83 in the cycle of the signals $\phi_{EV}$ (i.e., twice that of the basic clock pulses $\phi_S$). Outputs from the X decoder 82 are supplied to the first memory cell array 84 while outputs from the Y decoder 83 are supplied to a transfer gate 85. In a similar manner, the address counter 91 receives the signals $\phi_{OD}$ to supply odd address signals to an X decoder 92 and odd Y address signals to a Y decoder 93 in the cycle of the signals $\phi_{OD}$ (i.e., twice that of the basic clock pulses $\phi_S$). Outputs from the X decoder 92 are supplied to the second memory cell array 94 while outputs from the Y decoder 93 are supplied to a transfer gate 95. The transfer gate 85 supplies data read from the first memory cell array 84 to the sense amplifier 86 through an I/O line 102, while transferring data from the write circuit 88 received through the I/O line 102 to the first memory cell array 84. In a similar manner, the transfer gate 95 transfers data read from the second memory cell array 94 to the sense amplifier 96 through an I/O line 103, while transferring data from the write circuit 98 received through the I/O line 103 to the second memory cell array 94. The sense amplifier 86 is controlled by the signals $SE_{EV}$ to amplify the read data thereby to supply the same to the data latch 87, which in turn temporarily stores the outputs from the sense amplifier 86. When the signals $SE_{EV}$ are at low levels, the data latch 87 is electrically cut off from the sense amplifier 86. Data from the data latch 87 are transferred to the output latch 89 when the signals $OE_{EV}$ are at high levels. In a similar manner, the sense amplifier 96 is controlled by the signals $SE_{OD}$ to amplify the read data thereby to supply the same to the data latch 97, which in turn temporarily stores the outputs from the sense amplifier 96. When the signals $SE_{OD}$ are at low levels, the data latch 97 is electrically cut off from the sense amplifier 96. Further, data from the data latch 97 are transferred to the output latch 89 during when the signals $OE_{OD}$ are at high levels. The output latch 89 outputs the data delayed by M cycles synchronously with the basic clock pulses $\phi_S$, to supply the same to output terminals $80_1$ to $80_n$. The address counters 81 and 91 are respectively provided with reset circuits (not shown), to be reset every M cycles.

FIG. 4 is a timing chart for illustrating operation of the embodiment as shown in FIG. 3. With reference to FIG. 4, description is now made on the operation of the embodiment as shown in FIG. 3. In the following description, symbols $D_1$ to $D_M$ respectively indicate input data received through input terminals $90_1$ to $90_n$ to be newly stored in respective addresses $A_1$ to $A_M$ of the memory cell arrays 84 and 94 and symbols $PD_1$ to $PD_M$ respectively indicate output data read from the respective addresses $A_1$ to $A_M$.

The timing generator 101 generates the signals $\phi_{EV}$ and the signals $\phi_{OD}$ antiphase thereto by dividing the basic clock pulses $\phi_S$. The address counter 81 is driven by the signals $\phi_{EV}$ to generate even address signals $Ad_{ev}$ in a cycle twice that of the basic clock pulses $\phi_S$, to output even X address signals to the X decoder 82 and even Y address signals to the Y decoder 83. On the other hand, the address counter 91 is driven by the signals $\phi_{OD}$ to generate odd address signals $Ad_{OD}$ twice the basic clock pulses $\phi_S$ in cycle, to output odd X address signals to the X decoder 92 and odd Y address signals to the Y decoder 93. It is to be noted here that the even address signals $Ad_{EV}$ are phase-shifted from the odd address signals $Ad_{OD}$ respectively by one cycle of the basic clock pulses $\phi_S$.

Assuming that the output of the address counter 81 designates the address $A_2$ in the first memory cell array 84, n memory cells positioned in the address $A_2$ are accessed by the X and Y decoders 82 and 83, so that n-bit data $PD_2$ already stored (M−1) cycles ahead are read on the I/O line 102 through the transfer gate 85. The data $PD_2$ are amplified by the sense amplifier 86 in a high-level period of the signal $SE_{EV}$, to be fetched in the data latch 87. The data latch 87 is electrically cut off from the sense amplifier 86 on the trailing edge of the signal $SE_{EV}$, thereby to hold the read data $PD_2$ in the low-level period of the signal $SE_{EV}$. The data $PD_2$ held in the data latch 87 are transferred to the output latch 89 in a high-level period of the signal $OE_{EV}$, to be outputted from n output terminals $80_1$ to $80_n$. On the other hand, the write circuit 88 operates in a high-level period of the signal $WE_{EV}$ to write new n-bit data $D_2$ received through the input terminals $90_1$ to $90_n$ to be stored in an input latch 99 in the memory cells of the same address $A_2$. Thus completed is read-modified-write operation (the series operational period is hereinafter referred to "address cycle") for the address $A_2$.

In the second memory cell array 94, an address cycle for the address $A_3$ starts after the lapse of one cycle of the basic clock pulses $\phi_S$ from the start of the address cycle for the address $A_2$. The output from the address counter 91 designates the address $A_3$ and n memory cells positioned in the address $A_3$ are accessed by the X and Y decoders 92 and 93, so that n-bit data $PD_3$ already stored (M−1) cycles ahead are read on the I/O line 103 through the transfer gate 95. The data $PD_3$ are amplified by the sense amplifier 96 in a high-level period of the signal $SE_{OD}$ to be fetched in the data latch 97. The data latch 97 is electrically cut off from the sense amplifier 96 on the trailing edge of the signal $SE_{OD}$, thereby to hold the read data $PD_3$ in the low-level period of the signal $SE_{OD}$. Then the signal $OE_{OD}$ is turned to a high level, whereby the data $PD_3$ are transferred to the output latch 89 to be outputted from n output terminals $80_1$ to $80_n$. On the other hand, the write circuit 98 operates when the signal $WE_{OD}$ is at a high level to write new n-bit data $D_3$ received through the input terminals $90_1$ to $90_n$ to be stored in the input latch 99 in memory cells of the address $A_3$. Thus, the address cycle for the address $A_3$ is completed. After the lapse of one cycle of the basic clock pulses $\phi_S$ from the start of the address cycle for the address $A_3$, an address cycle for the address $A_4$ starts in the first memory cell array 84 to read new data $PD_4$.

As hereinabove described, the input data received at the clock rate of the basic clock pulses $\phi_S$ are alternately written in the first and second memory cell arrays 84 and 94, while being alternately outputted from the output terminals $80_1$ to $80_n$ in delay by M cycles of the basic clock pulses $\phi_S$ from the points of time the read data from the memory cell arrays 84 and 94 are received, at the clock rate of the basic clock pulses $\phi_S$. Thus, the circuit as shown in FIG. 3 serves as a digital delay unit attaining delay of M cycles.

Although the signals $OE_{EV}$ and $OE_{OD}$ are employed for controlling the outputs of the data latches 87 and 97, they may be replaced by the signals $\phi_{EV}$ and $\phi_{OD}$. Further, the signals $WE_{EV}$ and $WE_{OD}$ may be replaced by the signals $SE_{OD}$ and $SE_{EV}$.

Although the signals $SE_{EV}$ are activated in the first half periods (each corresponding to one cycle of the basic clock pulses $\phi_S$) of the address cycles for the even addresses and the signals $WE_{EV}$ are activated in the second half periods (each corresponding to one cycle of the basic clock pulses $\phi_S$), both of the signals $SE_{EV}$ and $WE_{EV}$ may be activated in the second half periods of the even address cycles. The point is that the read-modified-write operation is completed within the address cycle for each even address. This also applies to the signals $SE_{OD}$ and $WE_{OD}$ in the address cycles for the odd addresses.

Further, although the two memory cell arrays having address spaces of the same storage capacity are accessed to obtain data delay even times the unit delay in the aforementioned embodiment, a means such as a single stage delay circuit (register) may be provided immediately in front or at the back of the output latch 89, in order to attain data delay of odd times.

In addition, the digital delay unit according to the present invention may be implemented by a static memory circuit or a dynamic memory circuit.

Figure 5:
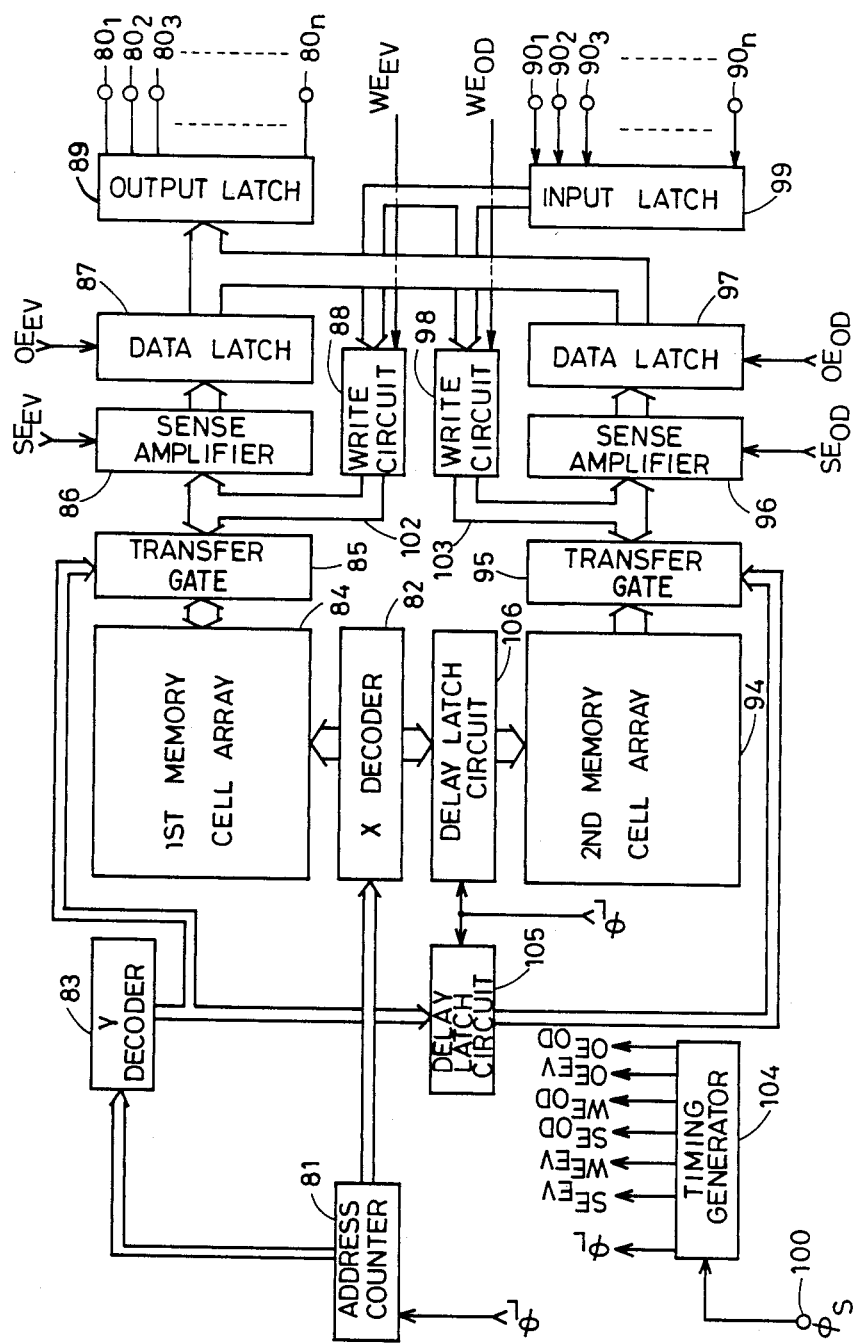
FIG. 5 is a block diagram showing another embodiment of the present invention.
Figure 7:
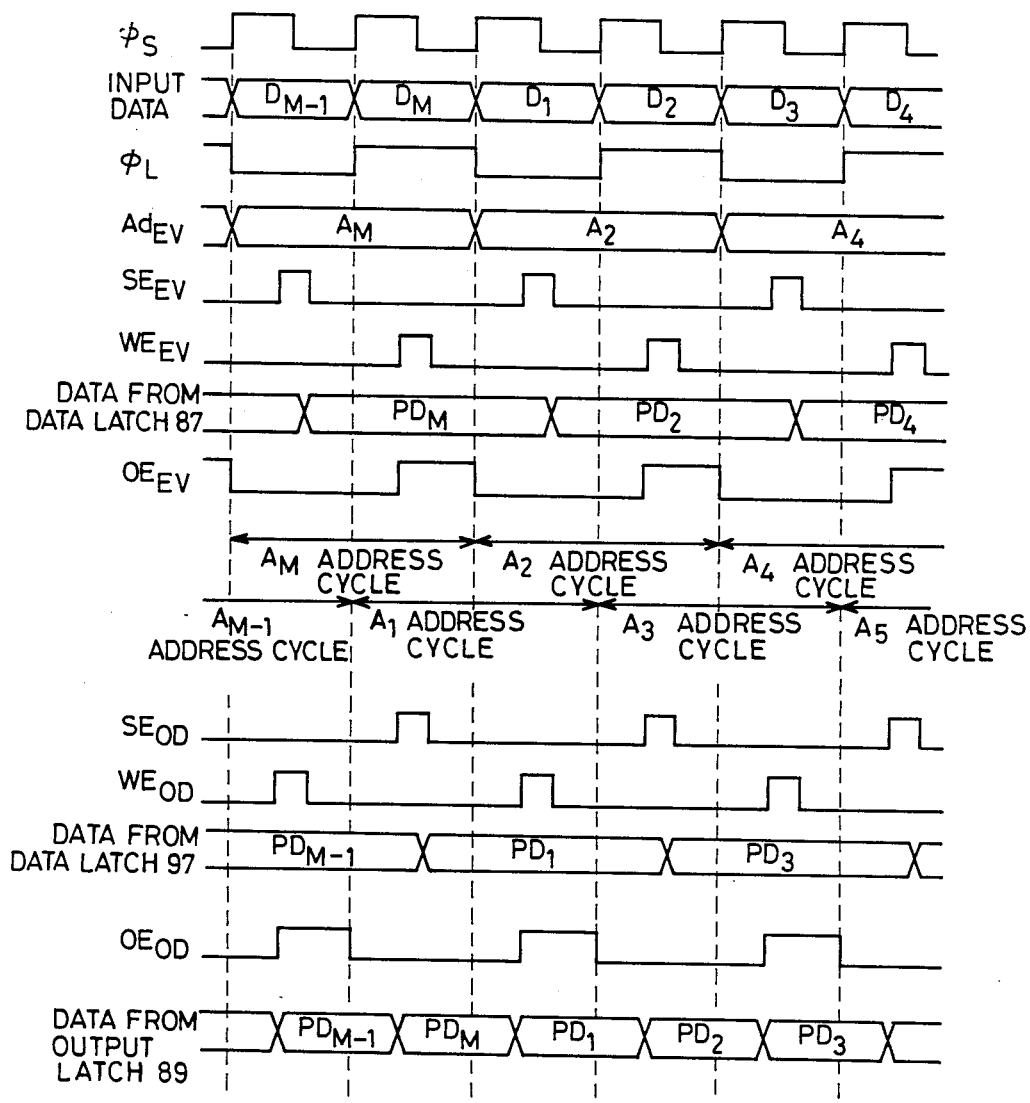
FIG. 7 is a timing chart for illustrating operation of the embodiment as shown in FIG. 5.

FIG. 5 is a block diagram showing another embodiment of the present invention. In FIG. 5, components identical to those of the embodiment as shown in FIG. 3 are indicated by the same reference numerals, and description thereof is omitted. In FIG. 5, a timing generator 104 receives basic clock pulses $\phi_S$ from an input terminal 100, to generate various timing signals $\phi_L$, $SE_{EV}$, $SE_{OD}$, $WE_{EV}$, $WE_{OD}$, $OE_{EV}$ and $OE_{OD}$ on the basis of the basic clock pulses $\phi_S$ in timing sequence as shown in FIG. 7. The signals $\phi_L$ are obtained by frequency division of the basic clocks $\phi_S$ to be doubled in cycle and inputted in an address counter 81 and delay latch circuits 105 and 106.

The address counter 81 receives the signals $\phi_L$ to supply even X address signals to an X decoder 82 and even Y address signals to a Y decoder 83 in the cycle of the signals $\phi_L$. Outputs from the X decoder 82 are supplied to a first memory cell array 84 and a delay latch circuit 106. Outputs from the Y decoder 83 are supplied to a transfer gate 85 and a delay latch circuit 105. Outputs from the delay latch circuit 106 are supplied to a second memory cell array 104 while those from the delay latch circuit 105 are supplied to a transfer gate 95.

Figure 6:
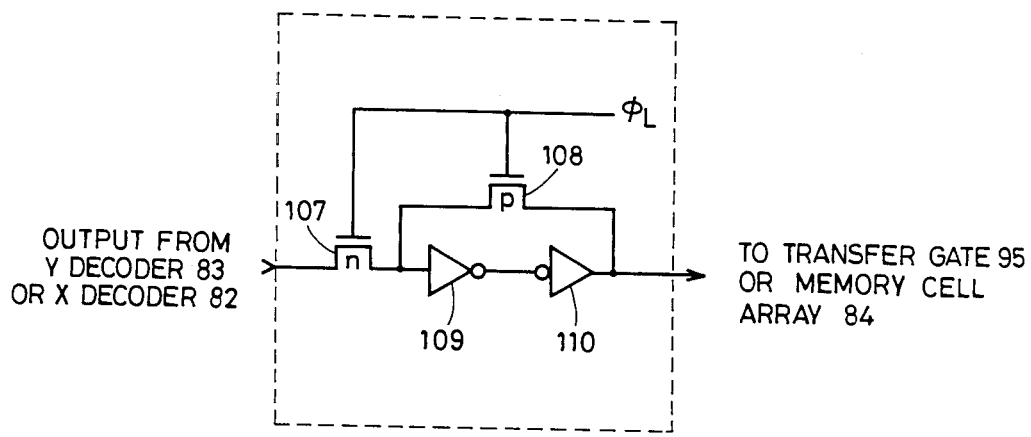
FIG. 6 is a circuit diagram showing an example of a delay latch circuit as shown in FIG. 5.

The delay latch circuits 105 and 106 are formed by a plurality of parallel latches, which are controlled by the internal clock pulses $\phi_L$. FIG. 6 shows an example of circuit structure of such a latch. The latch circuit as shown in FIG. 6 is implemented by a well-known CMOS static latch circuit, which is formed by inverters 109 and 110, an NMOS transfer gate 107 and a PMOS transfer gate 108. The inverters 109 and 110 are connected in series to each other so that the NMOS transfer gate 107 transfers outputs from the Y decoder 83 (or X decoder 82) to the inverter 109 and the PMOS transfer gate 108 bridges the input terminal of the inverter 109 and the output terminal of the inverter 110. The outputs of the inverter 110 are supplied to the transfer gate 95 (or memory cell array 94). Further, the transfer gates 107 and 108 receive the clock pulses $\phi_L$ at the gate electrodes thereof. Thus, the delay latch circuits 105 and 106 are formed by a plurality of static latches as shown in FIG. 6 arranged in parallel.

FIG. 7 is a timing chart for illustrating operation of the embodiment as shown in FIG. 5. With reference to FIG. 7, description is now made on the operation of this embodiment. In the following description, symbols $D_1$ to $D_M$ respectively indicate n-bit input data received in an input latch 99 through input terminals $90_1$ to $90_n$ to be newly stored in respective addresses $A_1$ to $A_M$, and symbols $PD_1$ to $PD_M$ respectively indicate output data read from the respective addresses $A_1$ to $A_M$. First, the basic clock pulses $\phi_S$ are divided so that the timing generator 104 generates the internal clock pulses $\phi_L$. On the trailing edges of the internal clock pulses $\phi_L$, the address counter 81 is incremented to generate even address signals $Ad_{EV}$ (see FIG. 7) twice the basic clock pulses $\phi_S$ in cycle thereby to supply even X address signals to the X decoder 82 and even Y address signals to the Y decoder 83. Thus, selected in even address cycles are memory cells in the first memory cell array 84 forming an even address plane by the outputs from the X and Y decoders 82 and 83.

The latch (see FIG. 6) forming the delay latch circuit 106 fetches the outputs from the X decoder 82 on the leading edges of the clock pulses $\phi_L$, and hence the delay latch circuit 106 delays the outputs from the X decoder 82 respectively by one cycle of the basic clock pulses $\phi_S$ to transfer the same to the second memory cell array 94. Since the latch as shown in FIG. 6 is well known in the art and the operation thereof would be easily understood by those skilled in the art, detailed description is omitted. In a similar manner, the delay latch circuit 105 delays the outputs from the Y decoder 83 respectively by one cycle of the basic clock pulses $\phi_S$ to transmit the same to the transfer gate 95. Thus, selected are memory cells in the second memory cell array 65 forming an odd address plane by the outputs from the delay latch circuits 105 and 106. It is to be noted that odd address cycles are always delayed from the even address cycles respectively by one cycle of the basic clock pulses $\phi_S$. Thus, this embodiment is equivalent in operation to that shown in FIG. 3.

Although the address counter 81 generates the even address signals to be delayed by the delay latch circuits 105 and 106 thereby to obtain the odd address signals in the embodiment as shown in FIG. 5, the address counter 81 may generate odd address signals, to delay the same respectively by one cycle of the basic clock pulses $\phi_S$ thereby to obtain even address signals.

Further, although the outputs of the data latches 87 and 97 are controlled by the signals $OE_{EV}$ and $OE_{OD}$, they may in place be controlled by the clock pulses $\phi_L$ and inverted signals thereof.

According to the aforementioned embodiment as shown in FIG. 5, the address signals are generated to access the memory cells of either the first or second memory cell array to obtain the address signals for accessing the memory cells of the other memory cell array by delaying the said address signals respectively by one cycle of the basic clock pulses $\phi_S$, and hence two types of address signals can be obtained by only one address signal generator means, whereby the circuit structure is simplified in comparison with that of the embodiment as shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital delay unit controlled in synchronization with basic clock pulses $\phi_S$ to output a signal representing an input signal delayed by a prescribed time period of arbitrary maximum length of M times the period of said basic clock pulses, said digital delay unit comprising:

input terminals for receiving input data in synchronization with said basic clock pulses $\phi_S$;

even address signal generator means for generating address signals synchronized with said basic clock pulses $\phi_S$ so that single different address signals are generated respectively upon alternate ones of said basic clock pulses $\phi_S$;

odd address signal generator means for generating address signals synchronized with said basic clock pulses $\phi_S$ so that single different address signals are generated respectively upon the remaining alternate ones of said basic clock pulses $\phi_S$;

a first memory cell array having M/2 addressable locations for addresses to be designated by said even address signal generator means;

a second memory cell array having M/2 addressable locations for addresses to be designated by said odd address signal generator means;

first latch means for temporarily storing and holding data which is address-designated by said even address signal generator means and read from said first memory cell array;

first data write means for writing, during storage and holding of said data from said first memory cell array by said first latch means, input data from said input terminals in memory cells of said first memory cell array currently designated by said even address signal generator means;

second latch means for temporarily storing and holding data which is address-designated by said odd address signal generator means and read from said second memory cell array;

second data write means for writing, during storage and holding of said data from said second memory cell array by said second latch means, input data from said input terminals in memory cells of said second memory cell array currently designated by said odd address signal generator means;

means for alternately outputting data stored in said first and second latch means at the clock rate of said basic clock pulses $\phi_S$;

wherein said first data write means writes data to said first memory cell array while data is read from said second memory cell array and said second data write means writes data to said second memory cell array while data is read from said first memory cell array.

2. A digital delay unit as claimed in claim 1, wherein one of said odd address signal generator means and said even address signal generator means includes delay means for delaying the address signal generated by the other of said odd address signal generating means and said even address signal generating means by one cycle of said basic clock pulses $\phi_S$.

3. A digital delay unit controlled in synchronization with basic clock pulses $\phi_S$ to output a signal representing an input signal delayed by a prescribed time period of arbitrary maximum length of M times the period of said basic clock pulses, said digital delay unit comprising:

input terminals for receiving input data in synchronization with said basic clock pulses $\phi_S$;

first address signal generator means for generating address signals synchronized with said basic clock pulses $\phi_S$ so that different address signals are generated respectively upon alternate ones of said basic clock pulses $\phi_S$;

second address signal generator means for generating address signals synchronized with said basic clock pulses $\phi_S$ and including delay means for delaying address signals generated by said first address signal generator means for a period of one clock cycle;

a first memory cell array having M/2 addressable locations for addresses to be designated by said first address signal generator means;

a second memory cell array having M/2 addressable locations for addresses to be designated by said second address signal generator means;

first latch means for temporarily storing and holding data which is address-designated by said first address signal generator means and read from said first memory cell array;

first data write means for writing, during storage and holding of said data from said first memory cell array by said first latch means, input data from said input terminals in memory cells of said first memory cell array currently designated by said first address signal generator means;

second latch means for temporarily storing and holding data which is address-designated by said second address signal generator means and read from said second memory cell array;

second data write means for writing, during storage and holding of said data from said second memory cell array by said second latch means, input data from said input terminals in memory cells of said second memory cell array currently designated by said second address signal generator means;

means for alternately outputting data stored in said first and second latch means at the clock rate of said basic clock pulses $\phi_S$;

wherein said first data write means writes data to said first memory cell array while data is read from said second memory cell array and said second data write means writes data to said second memory cell array while data is read from said first memory cell array.

4. A digital delay unit controlled in synchronization with basic clock pulses $\phi_S$ to output a signal representing an input signal delayed by a prescribed time period of arbitrary maximum length of M times the period of said basic pulses, said digital delay unit comprising:

input terminals for receiving input data in synchronization with said basic clock pulses $\phi_S$;

address signal generator means for generating address signals in synchronization with said basic clock pulses $\phi_S$, alternately generating even address signals and odd address signals respectively corresponding to alternate ones of said basic clock pulses $\phi_S$, said address signal generator means including delay means for delaying one of said even address signals and said odd address signals by one cycle of said basic clock pulses $\phi_S$;

a first memory cell array having an address space for M/2 addresses to be designated by said even address signals;

a second memory cell array having an address space for M/2 addresses to be designated by said odd address signals;

first latch means for temporarily storing and holding data which is address-designated by said even address signals and read from said first memory cell array;

first data write means for writing, during storage and holding of said data from said first memory cell array by said first latch means, input data from said input terminals in memory cells of said first memory cell array currently designated by said even address signals;

second latch means for temporarily storing and holding data which is address-designated by said odd address signals and read from said second memory cell array;

second data write means for writing, during storage and holding of said data from said second memory cell array by said second latch means, input data from said input terminals in memory cells of said second memory cell array currently desigated by said odd address signals;

means for alternately outputting data stored in said first and second latch means at the clock rate of said basic clock pulses $\phi_S$;

wherein said first data write means writes data to said first memory cell array while data is read from said second memory cell array and said second data write means writes data to said second memory array while data is read from said first memory cell array.

* * * * *